US008803591B1

(12) United States Patent
Roy et al.

(10) Patent No.: US 8,803,591 B1
(45) Date of Patent: Aug. 12, 2014

(54) MOS TRANSISTOR WITH FORWARD BULK-BIASING CIRCUIT

(71) Applicants: Amit Roy, Noida (IN); Amit Kumar Dey, Noida (IN); Kulbhushan Misri, Gurgaon (IN); Vijay Tayal, Noida (IN); Chetan Verma, Noida (IN)

(72) Inventors: Amit Roy, Noida (IN); Amit Kumar Dey, Noida (IN); Kulbhushan Misri, Gurgaon (IN); Vijay Tayal, Noida (IN); Chetan Verma, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/072,809

(22) Filed: Nov. 6, 2013

(51) Int. Cl.
*H03K 3/01* (2006.01)
*G05F 5/00* (2006.01)
*H03K 19/00* (2006.01)
*G05F 3/20* (2006.01)

(52) U.S. Cl.
CPC .............. *G05F 5/00* (2013.01); *H03K 19/0027* (2013.01); *G05F 3/205* (2013.01)
USPC ........................................ 327/534; 327/535

(58) Field of Classification Search
CPC .... G05F 3/205; G11C 5/146; H03K 19/0021; H03K 19/0027; H03K 19/00315; H03K 19/346; H03K 19/361; H03K 19/369
USPC .................................................. 327/534, 535
See application file for complete search history.

(56) References Cited

U.S. PATENT DOCUMENTS

| | | | | |
|---|---|---|---|---|
| 5,382,846 A * | 1/1995 | Shigehara et al. | ............... | 326/68 |
| 5,767,733 A * | 6/1998 | Grugett | .................... | 327/534 |
| 5,880,620 A * | 3/1999 | Gitlin et al. | .................... | 327/534 |
| 6,173,424 B1 * | 1/2001 | Voshell et al. | ................ | 714/718 |
| 6,177,826 B1 * | 1/2001 | Mashiko et al. | ................ | 327/534 |
| 6,225,846 B1 * | 5/2001 | Wada et al. | .................... | 327/215 |
| 6,304,110 B1 | 10/2001 | Hirano | | |
| 6,429,684 B1 | 8/2002 | Houston | | |
| 6,469,568 B2 * | 10/2002 | Toyoyama et al. | ............ | 327/534 |
| 6,661,277 B2 | 12/2003 | Dabral | | |
| 6,891,419 B2 * | 5/2005 | Kartschoke et al. | .......... | 327/208 |
| 7,385,436 B2 * | 6/2008 | Itoh et al. | ....................... | 327/534 |
| 7,714,638 B2 | 5/2010 | Ryu | | |
| 7,755,395 B2 * | 7/2010 | Yoshii et al. | ..................... | 326/83 |
| 8,207,784 B2 * | 6/2012 | Tsividis | ........................ | 327/534 |
| 2002/0195623 A1 * | 12/2002 | Horiuchi | ....................... | 257/200 |
| 2007/0229145 A1 * | 10/2007 | Kapoor et al. | ................ | 327/534 |
| 2011/0012672 A1 | 1/2011 | Ogawa | | |
| 2012/0062313 A1 | 3/2012 | Engels | | |
| 2012/0206188 A1 | 8/2012 | Duong | | |

* cited by examiner

*Primary Examiner* — Thomas J Hiltunen
(74) *Attorney, Agent, or Firm* — Charles Bergere

(57) ABSTRACT

Forward bulk biasing circuitry for PMOS and NMOS transistors is provided. The bulk biasing circuitry includes two N-type MOS transistors, two P-type MOS transistors, and two capacitors. The forward bias to a bulk terminal of a transistor increases a threshold voltage of a transistor, thereby reducing a transition time and improving the performance of the transistor. The forward bias is provided only when the transistor transitions from one state to another, thereby reducing leakage power dissipation during active and standby modes of an integrated circuit that includes the transistor.

10 Claims, 3 Drawing Sheets

US 8,803,591 B1

MOS TRANSISTOR WITH FORWARD BULK-BIASING CIRCUIT

BACKGROUND OF THE INVENTION

The present invention relates generally to electronic circuits, and more specifically, to a MOS transistor with a forward bulk-biasing circuit.

Recent years have witnessed an increased demand for small, high-performance electronic devices. This demand has been addressed primarily with the evolution of integrated circuits (ICs) designed using very large scale integration (VLSI). Using VLSI, electronic circuits may by designed by combining hundreds of thousands of transistors onto a single IC. This is achieved by miniaturizing transistors to sizes on the order of about 50 nanometer (nm) or less. Integrating large numbers of transistors on a single chip has successfully enabled design of small electronic devices with high processing power.

Although, reduced transistor size leads to a direct design benefit of increased processing power, it also leads to a design trade-off by increasing power consumption of the transistors and hence, that of the ICs. Since the ICs are widely used in portable devices that have limited power storage, it is desirable that the ICs have low power consumption to allow for extended and long-lasting battery life. There are numerous ways in which transistor power consumption can be reduced, for example, by reducing the supply voltage ($V_{dd}$) provided to the transistors. However a reduction in the supply voltage $V_{dd}$ decreases the processing, thereby degrading performance.

Processing speed can be increased by reducing a threshold voltage ($V_{th}$) of the transistors. A reduction in threshold voltage $V_{th}$ can be achieved by forward biasing a bulk terminal of the transistor to increase bulk-to-source ($V_{bs}$) voltage. However, a reduction in the threshold voltage $V_{th}$ of the transistor during power-up and standby modes of the IC leads to an exponential increase in leakage current, which considerably increases leakage power dissipation. Thus, the decreased power consumption obtained by reducing the supply voltage $V_{dd}$ is nullified by the increased power consumption due to continuous biasing of the bulk terminal during the power-up and standby modes of the IC.

Therefore, it would be advantageous to have a forward bulk-bias circuit that biases a bulk terminal of a transistor of an IC when the IC transitions between power-up and standby modes, improves performance and reduces leakage power dissipation of the transistor, and overcomes the above-mentioned limitations of conventional forward bulk-bias circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
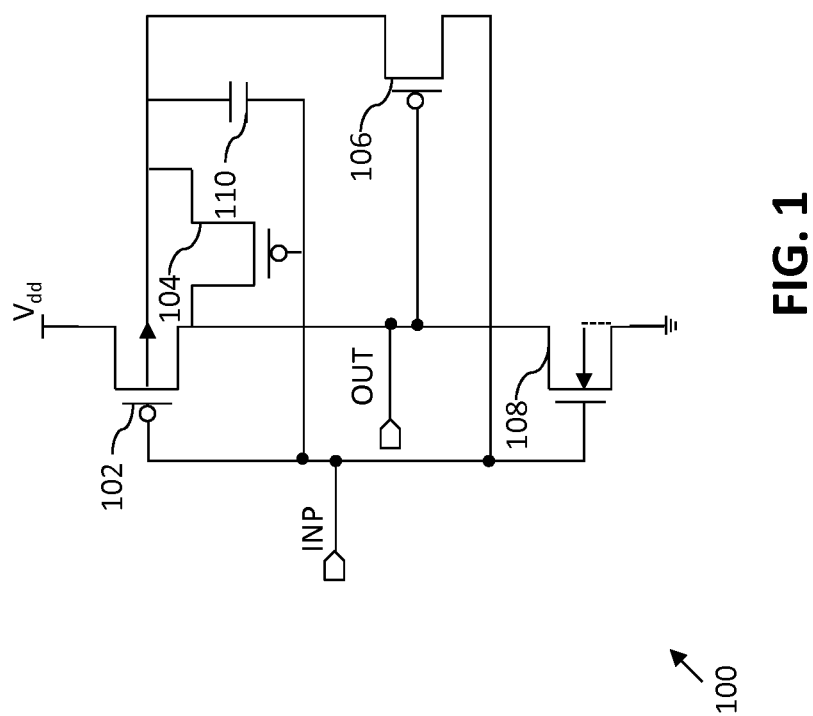
FIG. 1 is a schematic circuit diagram of a forward bulk-biasing circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a forward bulk-biasing circuit is provided. The forward bulk-biasing circuit includes a first transistor having a source terminal for receiving a supply voltage and a gate terminal for receiving an input signal; a second transistor having a drain terminal connected to a bulk terminal of the first transistor for forward bulk-biasing the bulk terminal, a source terminal connected to a drain terminal of the first transistor, and a gate terminal connected to the gate terminal of the first transistor for receiving the input signal; a capacitor having a first terminal connected to the drain and bulk terminals of the second and first transistors, respectively, and a second terminal connected to the gate terminal of the second transistor; and a third transistor having a source terminal connected to the first terminal of the capacitor, a drain terminal connected to the gate terminal of the first transistor, and a gate terminal connected to the drain terminal of the first transistor.

In another embodiment of the present invention, a forward bulk-biasing circuit is provided. The forward bulk-biasing circuit includes a first transistor having a source terminal shorted to ground and a gate terminal for receiving an input signal; a second transistor having a source terminal connected to a bulk terminal of the first transistor for forward bulk-biasing the bulk terminal, a drain terminal connected to the gate terminal of the first transistor for receiving the input signal, and a gate terminal connected to a drain terminal of the first transistor; a capacitor having a first terminal connected to the source and bulk terminals of the second and first transistors, respectively, and a second terminal connected to the gate terminal of the first transistor for receiving the input signal; and a third transistor having a source terminal connected to the first terminal of the capacitor and the bulk terminal of the first transistor, a drain terminal connected to the drain terminal of the first transistor, and a gate terminal connected to the gate terminal of the first transistor.

In yet another embodiment of the present invention, a forward bulk-biasing circuit is provided that includes a first transistor having a source terminal shorted to ground, and a gate terminal for receiving an input signal; a second transistor having a source terminal connected to a bulk terminal of the first transistor for forward bulk-biasing the bulk terminal of the first transistor, a drain terminal connected to the gate terminal of the first transistor for receiving the input signal, and a gate terminal connected to a drain terminal of the first transistor; a first capacitor having a first terminal connected to the source and bulk terminals of the second and first transistors, respectively, and a second terminal connected to the gate terminal of the first transistor for receiving the input signal; a third transistor having a drain terminal connected to the gate terminal of the first transistor for receiving the input signal, and a gate terminal connected to the drain terminal of the first transistor; a fourth transistor having a drain terminal connected to the first terminal of the first capacitor, a gate terminal connected to the gate terminal of the first transistor and to the second terminal of the first capacitor, and a source terminal connected to the gate terminal of the third transistor; a fifth transistor having a source terminal connected to the drain terminal of the first transistor, and a gate terminal connected to the gate terminal of the first transistor for receiving the input signal; a second capacitor having a first terminal connected to a drain terminal of the fifth transistor, and a second terminal connected to the gate terminals of the first and fifth transistors for receiving the input signal; and a sixth transistor having a source terminal for receiving a supply voltage, a gate terminal connected to the gate terminal of the first transistor for receiving the input signal, a drain terminal connected to the drain terminal of the first transistor, and a bulk terminal connected to a drain terminal of the fifth transistor. The drain terminal of the fifth transistor forward bulk-biases the bulk terminal of the sixth transistor.

Various embodiments of the present invention provide a forward bulk-biasing circuit for providing forward bias to a bulk terminal of a transistor. The forward bulk-biasing circuit includes a plurality of transistors connected to provide forward biasing to the bulk terminal of the transistor only when the transistor undergoes a transition from one state to another, i.e., either the transistor is being switched ON or switched OFF. The forward biasing of the bulk terminal increases a threshold voltage of the transistor, thereby reducing a transition time and improving the performance of the transistor. Since, the forward biasing is provided only when the transistor transitions from one state to another, an unwarranted increase in leakage current due to continuous forward biasing during ON and OFF states of the transistor is eliminated. Thus, the leakage power dissipation due to high leakage current is eliminated. Additionally, the gain in performance obtained due to an increased threshold voltage provides an opportunity to decrease a supply voltage, thus reducing dynamic and leakage power consumptions further, while maintaining original performance level of the transistor.

Referring now to FIG. 1, a schematic circuit diagram of a p-channel metal-oxide-semiconductor (PMOS) transistor with a forward bulk-biasing circuit 100 for biasing a PMOS transistor 102 in accordance with an embodiment of the present invention is shown. The forward bulk biasing circuit includes second through fourth transistors 104-108, and a capacitor 110.

The PMOS transistor 102 has a source terminal that is provided with a supply voltage ($V_{dd}$), and a gate terminal connected to an input terminal for receiving an input signal (INP). The second transistor 104 has a drain terminal connected to a bulk terminal of the PMOS transistor 102, a source terminal connected to a drain terminal of the PMOS transistor 102, and a gate terminal connected to the gate terminal of the PMOS transistor 102 and the input terminal for receiving the input signal INP. The capacitor 110 has a first terminal connected to the bulk and drain terminals of the PMOS and second transistors 102 and 104, respectively, and a second terminal connected to the gate terminal of the second transistor 104 and the input terminal. The third transistor 106 has a source terminal connected to the first terminal of the capacitor 110, a drain terminal connected to the gate terminal of the PMOS transistor 102 and the input terminal, and a gate terminal connected to the drain terminal of the PMOS transistor 102. The fourth transistor 108 has a drain terminal connected to the drain terminal of the PMOS transistor 102, a gate terminal connected to the gate terminal of the PMOS transistor 102 and the input terminal, and a source terminal connected to ground. In one embodiment of the invention, the fourth transistor 108 is a n-channel MOS (NMOS) transistor having a bulk terminal connected to ground. An output signal (OUT) is generated at a node between the drain terminals of the PMOS transistor 102 and the fourth transistor 108.

If the input signal INP is at logic one and the output signal OUT is at logic zero, the third transistor 106 is switched ON, which causes the bulk terminal of the PMOS transistor 102 to be pulled up to the level of the supply voltage $V_{dd}$. As a result, a bulk-to-source voltage ($V_{bs}$) remains at zero and thus the PMOS transistor 102 is in a zero body bias state.

When the input signal INP transitions from logic one to logic zero, a potential at the first terminal of the first capacitor 110 is reduced, which causes a potential at the bulk terminal of the PMOS transistor 102 to decrease. Additionally, the transitioning of the input signal INP to logic zero causes the second transistor 104 to begin to switch ON, which causes the potential at the bulk terminal of the PMOS transistor 102 to follow a potential at the drain terminal of the second transistor 104, i.e., the output signal OUT, which is at logic zero. Thus, during the transition of the input signal INP to logic zero, the potential at the bulk terminal of the PMOS transistor 102 decreases further, leading to an increase in the bulk-to-source voltage $V_{bs}$. The increase in the bulk-to-source voltage $V_{bs}$ causes an increase in a threshold voltage ($V_{th}$) of the PMOS transistor 102, leading to a decrease in a transition time of the PMOS transistor 102 and a gain in performance.

When the input signal INP has transitioned to logic zero, the PMOS transistor 102 and the second transistor 104 are switched ON completely. The switching ON of the second transistor 104 pulls up the potential at the bulk terminal of the PMOS transistor 102 to the level of the supply voltage $V_{dd}$. Thus, after the input signal INP has completely transitioned to logic zero, the bulk-to-source voltage $V_{bs}$ is reduced to zero, which decreases the threshold voltage $V_{th}$ to its original magnitude.

In an embodiment of the present invention, the second and third transistors 104 and 106 are PMOS transistors and the fourth transistor 104 is a NMOS transistor.

Figure 2:
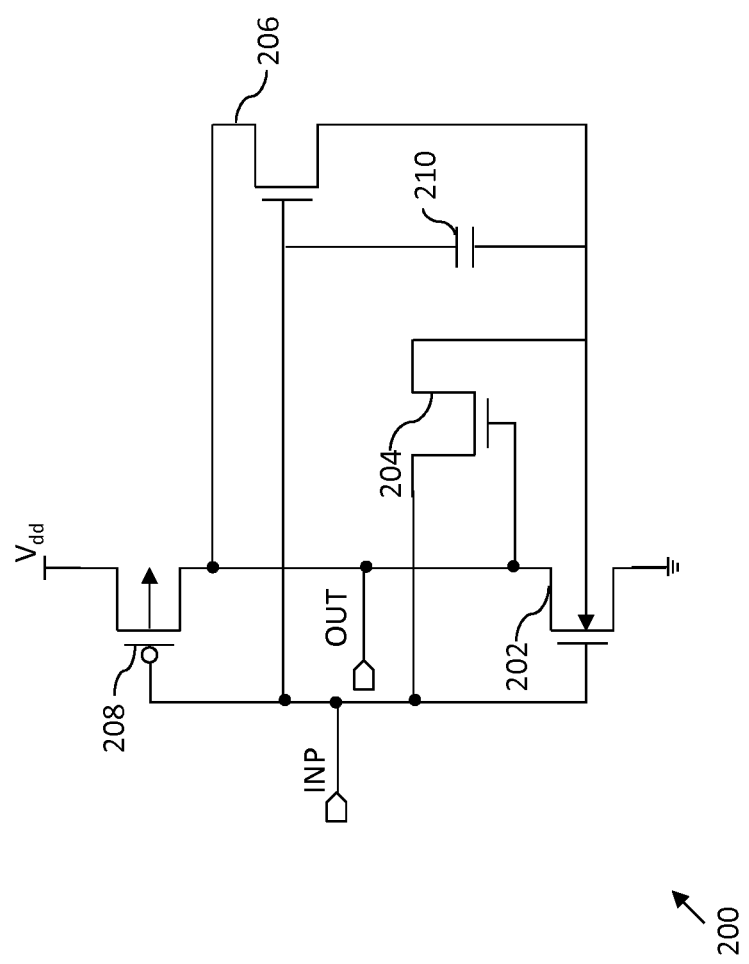
FIG. 2 is a schematic circuit diagram of a forward bulk-biasing circuit in accordance with another embodiment of the present invention.

Referring now to FIG. 2, a schematic circuit diagram of a NMOS transistor with a forward bulk-biasing circuit 200 for biasing a NMOS transistor 202, in accordance with an embodiment of the present invention, is shown. The forward bulk-biasing circuit includes second through fourth transistors 204-208, and a capacitor 210.

The NMOS transistor 202 has a source terminal connected to ground, and a gate terminal connected to an input terminal for receiving an input signal (INP). The second transistor 204 has a source terminal connected to a bulk terminal of the NMOS transistor 202, a drain terminal connected to the gate terminal of the NMOS transistor 202 and to the input terminal for receiving the input signal INP, and a gate terminal connected to a drain terminal of the NMOS transistor 202. The capacitor 210 has a first terminal connected to the bulk and source terminals of the NMOS transistor 202 and the second transistor 204, respectively, and a second terminal connected to the gate terminal of the NMOS transistor 202 and the input terminal. The third transistor 206 has a source terminal connected to the first terminal of the capacitor 210, the source terminal of the second transistor 204 and the bulk terminal of the NMOS transistor 202, and a gate terminal connected to the gate terminal of the NMOS transistor 202, the second terminal of the capacitor 210, and the input terminal. The fourth transistor 208 has a drain terminal connected to the drain terminals of the NMOS transistor 202 and the third transistor 206, a gate terminal connected to the gate terminal of the NMOS transistor 202 and the input terminal, and a source terminal is provided with the supply voltage $V_{dd}$. An output signal (OUT) is generated at a node connecting the drain terminals of the NMOS transistor 202 and the fourth transistor 208.

If the input signal INP is at logic one and the output signal OUT is at logic zero, the fourth transistor 208 is switched OFF and the NMOS transistor 202 is switched ON. Since the NMOS transistor 202 is ON, its drain terminal is at ground potential, causing the second transistor 204 to remain OFF and non-conducting. Thus, the bulk terminal of the NMOS transistor 202 remains at ground potential, causing the bulk-to-source voltage $V_{bs}$ to remain at zero.

When the input signal INP begins to transition from logic one to logic zero, the NMOS transistor 202 begins to switch OFF and the fourth transistor 208 begins to switch ON. Switching ON of the fourth transistor 208 causes a potential at its drain terminal to increase to the level of the supply voltage $V_{dd}$. The increasing potential at the drain terminal of the fourth transistor 208 causes a potential at the gate terminal of the second transistor 204 to increase, that in turn causes the second transistor 204 to switch ON. Switching ON of the second transistor 204 causes the potential at the bulk terminal of the NMOS transistor 202 to follow a magnitude of the input terminal INP, which is still at logic one. This causes the potential at the bulk terminal of the NMOS transistor 202 to increase, thereby increasing the bulk-to-source voltage $V_{bs}$ thereof. The increased bulk-to-source voltage $V_{bs}$ causes the threshold voltage $V_{th}$ of the NMOS transistor 202 to increase causing the transition time of the NMOS transistor 202 to decrease while the input signal INP transitions to logic zero.

When the input signal INP has transitioned to logic zero, the fourth transistor 208 is switched ON and the NMOS transistor 202 is switched OFF. The switched ON fourth transistor 208 causes the second transistor 204 to go ON. The switched ON second transistor 204 pulls down the potential at its source terminal, which in turn causes the potential at the bulk terminal of the NMOS transistor 202 to remain at ground potential, causing the bulk-to-source voltage $V_{bs}$ thereof to go to zero. Thus, after the input signal INP has transitioned completely to logic zero, the bulk-to-source voltage $V_{bs}$ is reduced to zero, thereby reducing the threshold voltage $V_{th}$ to the original magnitude.

In an embodiment of the present invention, the second and third transistors 204 and 206 are NMOS transistors and the fourth transistor 208 is a PMOS transistor.

Figure 3:
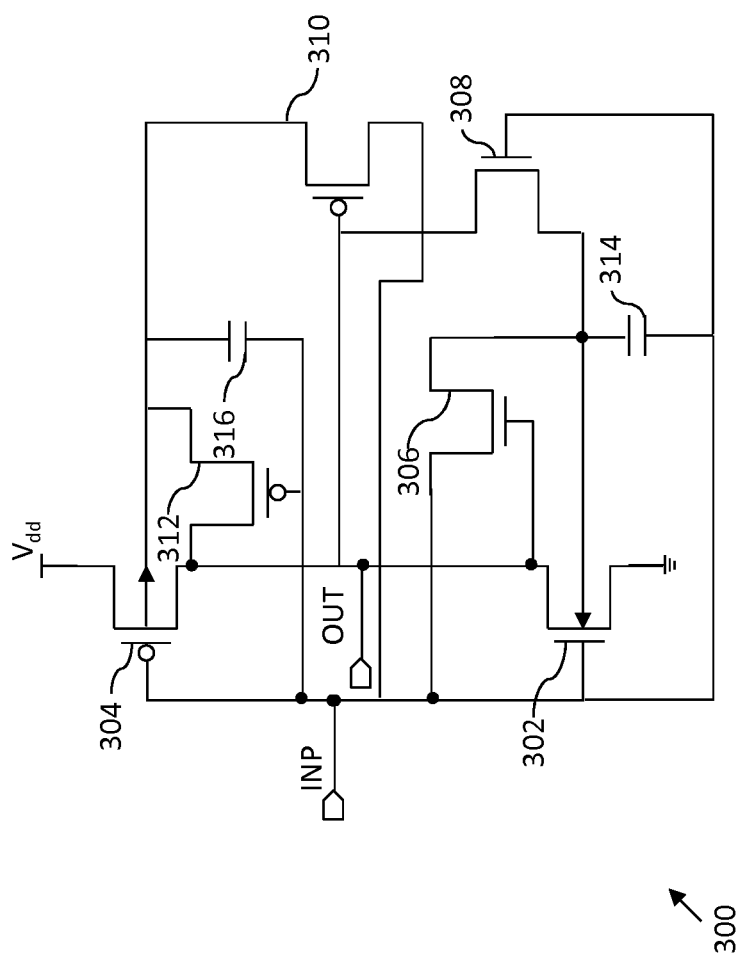
FIG. 3 is a schematic circuit diagram of a forward bulk-biasing circuit in accordance with yet another embodiment of the present invention.

Referring now to FIG. 3, a schematic circuit diagram of a forward bulk-biasing circuit 300 for biasing a NMOS transistor 302 and a PMOS transistor 304, in accordance with yet another embodiment of the present invention, is shown. The forward bulk-biasing circuit 300 includes first through fourth transistors 306-312, and first and second capacitors 314 and 316.

The NMOS transistor 302 has a source terminal connected to ground, and a gate terminal connected to an input terminal for receiving an input signal INP. The first capacitor 314 has a first terminal connected to the gate terminal of the NMOS transistor 302 and a second terminal connected to a bulk terminal of the NMOS transistor 302. The first transistor 306 has a source terminal also connected to the bulk terminal of the NMOS transistor 302 and the second terminal of the first capacitor 314, a drain terminal connected to the gate terminal of the NMOS transistor 302 and the input terminal, and a gate terminal connected to a drain terminal of the NMOS transistor 302. The second transistor 308 has a drain terminal connected to the second terminal of the first capacitor 314, and a gate terminal connected to the first terminal of the first capacitor 314, the gate terminal of the NMOS transistor 302, and to the input terminal.

The third transistor 310 has a drain terminal connected to the gate terminal of the NMOS transistor 302 and the input terminal, and a gate terminal connected to the drain terminal of the NMOS transistor 302 and to a source terminal of the second transistor 308. The second capacitor 316 has a first terminal connected to a source terminal of the third transistor 310, while a second terminal of the second capacitor 316 is connected to the gate terminal of the NMOS transistor 302 and the input terminal. The fourth transistor 312 has a drain terminal connected to the first terminal of the second capacitor 316, and a gate terminal connected to the second terminal of second capacitor 316, the gate terminal of the NMOS transistor 302, and the input terminal.

The PMOS transistor 304 has a source terminal provided with the supply voltage $V_{dd}$, a gate terminal connected to the input terminal and the gate terminal of the NMOS transistor 302, a drain terminal connected to the drain terminal of the NMOS transistor 302, the gate terminal of the third transistor 310, the source terminal of the second transistor 308 and to a source terminal of the fourth transistor 312, and a bulk terminal connected to the drain terminal of the fourth transistor 312 and the first terminal of the second capacitor 316. An output signal OUT is provided at a node between the drain terminals of the NMOS and PMOS transistors 302 and 304.

In an embodiment of the present invention, the first, and second transistors 306 and 308 also are NMOS transistors and the third and fourth transistors 310 and 312 are PMOS transistors.

The bulk terminal of the NMOS transistor 302 is provided with a forward bias by the combined operation of the first and second transistors 306 and 308, while the bulk terminal of the PMOS transistor 304 is provided with a forward bias by the third and fourth transistors 310 and 312. It will be apparent to those of skill in the art that the mechanism by which the first through fourth transistors 306-312 forward bias the bulk terminals of the NMOS and PMOS transistors 302 and 304 is a combination of the operations of the forward bulk-biasing circuits described above with reference to FIGS. 1 and 2. Therefore, redundant description has been excluded for the sake of brevity.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A forward bulk biasing circuit for a p-channel metal-oxide semiconductor (PMOS) transistor, comprising:
  a PMOS transistor (102) having a source terminal for receiving a supply voltage and a gate terminal connected to an input terminal for receiving an input signal;
  a second transistor (104) having a source terminal connected to a bulk terminal of the PMOS transistor for forward bulk-biasing the bulk terminal, a drain terminal connected to a drain terminal of the PMOS transistor, and a gate terminal connected to the gate terminal of the PMOS transistor and the input terminal for receiving the input signal;
  a capacitor (110) having a first terminal connected to the source terminal of the second transistor and the bulk terminal of the first transistor, and a second terminal connected to the gate terminals of the PMOS transistor and the second transistor; and
  a third transistor (106) having a drain terminal connected to the first terminal of the capacitor, a source terminal connected to the input terminal and the gate terminal of the first transistor, and a gate terminal connected to the drain terminal of the PMOS transistor, wherein an output signal is generated at an output terminal connected to the drain terminal of the PMOS transistor.

2. The forward bulk-biasing circuit of claim 1, further comprising a n-channel MOS transistor (108) having a drain terminal connected to the drain terminal of the PMOS transistor, a gate terminal connected to the gate terminal of the PMOS transistor, and a source terminal connected to ground.

3. The forward bulk-biasing circuit of claim 2, wherein a bulk terminal of the NMOS transistor is connected to ground.

4. The forward bulk-biasing circuit of claim 2, wherein the second, and third transistors are p-channel MOS transistors.

5. A forward bulk-biasing circuit for a n-channel metal oxide semiconductor (NMOS) transistor, comprising:
   a NMOS transistor (202) having a source terminal connected to ground, and a gate terminal connected to an input terminal for receiving an input signal;
   a second transistor (204) having a source terminal connected to a bulk terminal of the NMOS transistor for forward bulk-biasing the bulk terminal, a drain terminal connected to the gate terminal of the NMOS transistor and the input terminal for receiving the input signal, and a gate terminal connected to a drain terminal of the NMOS transistor;
   a capacitor (210) having a first terminal connected to the source terminal of the second transistor and the bulk terminal of the NMOS transistor, and a second terminal connected to the gate terminal of the NMOS transistor and the input terminal for receiving the input signal; and
   a third transistor (206) having a drain terminal connected to the first terminal of the capacitor, the bulk terminal of the NMOS transistor and the source terminal of the second transistor, a source terminal connected to the drain terminal of the NMOS transistor, and a gate terminal connected to the gate terminal of the first transistor and the input terminal,
   wherein an output signal is generated at an output terminal connected to the drain of the NMOS transistor.

6. The forward bulk-biasing circuit of claim 5, further comprising a p-channel MOS transistor (208) having a drain terminal connected to the drain terminal of the NMOS transistor, a gate terminal connected to the gate terminal of the NMOS transistor and the input terminal for receiving the input signal, and a source terminal for receiving a supply voltage.

7. The forward bulk-biasing circuit of claim 6, wherein the second and third transistors are NMOS transistors.

8. A forward bulk-biasing circuit, comprising:
   a N-channel metal-oxide-semiconductor (NMOS) transistor (302) having a source terminal connected to ground, and a gate terminal connected to an input terminal for receiving an input signal;
   a first transistor (306) having a source terminal connected to a bulk terminal of the NMOS transistor for forward bulk-biasing the bulk terminal of the NMOS transistor, a drain terminal connected to the gate terminal of the NMOS transistor and the input terminal for receiving the input signal, and a gate terminal connected to a drain terminal of the NMOS transistor;
   a first capacitor (314) having a first terminal connected to the source terminal of the second transistor and the bulk terminal of the NMOS transistor, and a second terminal connected to the gate terminal of the NMOS transistor and the input terminal for receiving the input signal;
   a second transistor (308) having a drain terminal connected to the first terminal of the first capacitor, the source terminal of the first transistor and the bulk terminal of the NMOS transistor, and a gate terminal connected to the second terminal of the first capacitor, the gate terminal of the NMOS transistor and the input terminal;
   a third transistor (310) having a drain terminal connected to the gate terminal of the first transistor and the input terminal for receiving the input signal, and a gate terminal connected to the drain terminal of the NMOS transistor and a source terminal of the second transistor;
   a fourth transistor (312) having a drain terminal connected to the source terminal of the third transistor, a gate terminal connected to the gate terminal of the NMOS transistor and the input terminal for receiving the input signal, and a source terminal connected to the drain terminal of the NMOS transistor;
   a second capacitor (316) having a first terminal connected to the drain terminal of the fourth transistor, and a second terminal connected to the gate terminals of the NMOS and fourth transistors and the input terminal for receiving the input signal; and
   a p-channel MOS (PMOS) transistor (304) having a source terminal for receiving a supply voltage, a gate terminal connected to the gate terminal of the NMOS transistor and the input terminal for receiving the input signal, a drain terminal connected to the drain terminal of the NMOS transistor, and a bulk terminal connected to the drain terminal of the fourth transistor, wherein the drain terminal of the fourth transistor forward bulk-biases the bulk terminal of the PMOS transistor, and
   wherein an output is generated at an output terminal connected to the drain terminals of the NMOS and PMOS transistors.

9. The forward bulk-biasing circuit of claim 8, wherein the first and second transistors are NMOS transistors.

10. The forward bulk-biasing circuit of claim 9, wherein the third and fourth transistors are PMOS transistors.

* * * * *